(12) United States Patent
Barbera-Guillem et al.

(10) Patent No.: US 6,179,912 B1
(45) Date of Patent: Jan. 30, 2001

(54) CONTINUOUS FLOW PROCESS FOR PRODUCTION OF SEMICONDUCTOR NANOCRYSTALS

(75) Inventors: Emilio Barbera-Guillem, Powell; Marlin O. Thurston, Columbus, both of OH (US)

(73) Assignee: BioCrystal Ltd., Westerville, OH (US)

(*) Notice: Under 35 U.S.C. 154(b), the term of this patent shall be extended for 0 days.

(21) Appl. No.: 09/468,418

(22) Filed: Dec. 20, 1999

(51) Int. Cl.[7] .................................................. C30B 7/08
(52) U.S. Cl. ........................ 117/68; 117/70; 117/953; 117/954; 117/957; 117/958; 422/245.1; 422/253
(58) Field of Search ........................... 422/245.1, 253; 117/953, 954, 957, 958, 68, 70

(56) References Cited

U.S. PATENT DOCUMENTS

| | | | |
|---|---|---|---|
| 4,374,093 | * | 2/1983 | Rollmann et al. ............... 422/253 |
| 5,251,618 | * | 10/1993 | Jong et al. ....................... 358/37 |
| 5,348,687 | * | 9/1994 | Beck et al. ...................... 252/582 |
| 5,474,591 | | 12/1995 | Wells et al. . |
| 5,505,928 | | 4/1996 | Alivisatos et al. . |
| 5,605,785 | * | 2/1997 | Texter et al. ..................... 430/546 |
| 5,757,018 | * | 5/1998 | Alivisatos et al. ................ 259/64 |
| 5,882,779 | * | 3/1999 | Lawardy ......................... 428/323 |
| 5,965,212 | | 10/1999 | Dobson et al. . |
| 6,126,740 | * | 10/2000 | Schultz et al. ..................... 117/4 |

* cited by examiner

Primary Examiner—Robert Kunemund
(74) Attorney, Agent, or Firm—M. Bud Nelson (57) ABSTRACT

Provided is a system and continuous flow process for producing monodisperse semiconductor nanocrystals comprising reservoirs for the starting materials, a mixing path in which the starting materials are mixed, a first reactor in which the mixture of starting materials is mixed with a coordinating solvent and in which nucleation of particles occurs, a second reactor in which controlled growth of the nanocrystals occurs, and a growth termination path in which the growth of the nanocrystals is halted.

27 Claims, 4 Drawing Sheets

CONTINUOUS FLOW PROCESS FOR PRODUCTION OF SEMICONDUCTOR NANOCRYSTALS

FIELD OF INVENTION

This invention relates to a system and method for producing semiconductor nanocrystals of a uniform size on a relatively large scale economically and efficiently. More particularly, the system and method of the present invention provide controlled delivery, controlled reaction time, and a controlled environment, to control the synthesis and development of semiconductor nanocrystals.

BACKGROUND OF THE INVENTION

Examples of semiconductor nanocrystals (also referred to as quantum dots) are known in the art to comprise a chemically linked combination of a cation and an anion. Suitable cations are generally selected from the group consisting of heavy metals including lanthanides, actinides, and transition elements. In applications involving optical properties, suitable cations particularly include, but are not limited to, transition metals. For example, known in the art are semiconductor nanocrystals consisting of cation Cd coupled to an anion selected from the group consisting of Se, S, and Te (collectively referred to as "CdX"). CdX quantum dots have been passivated with an inorganic coating ("shell") uniformly deposited thereon. The shell which is used to passivate the quantum dot may be preferably comprised of YZ wherein Y is Cd or Zn, and Z is S, or Se. Quantum dots have been exploited in applications generally in the field of optoelectronics. More recently, quantum dots are being modified to impart properties for water solubility. Water-soluble quantum dots, which are stable in aqueous solutions, have biological, biochemical, and industrial applications. More specifically, water-soluble quantum dots may be extremely sensitive in terms of detection, because of their fluorescent properties including, but not limited to, high quantum efficiency, resistance to photobleaching, and the capability of being excited with a single wavelength of light resulting in detectable fluorescence emissions of high quantum yield and with discrete fluorescence peaks. Passivating the surface of the core quantum dot can result in an increase in the quantum yield of the fluorescence emission, depending on the nature of the inorganic coating.

In optoelectronics applications, consistency of particle size and shape is important in the responsiveness and efficiency of optoelectronic devices utilizing quantum dots. Additionally, in applications relating to fluorescence detection, the size of the core of the quantum dot directly relates to the wavelength spectral range of the fluorescence emission. The size of quantum dots depends on several factors including, but not limited to, the starting concentration of the reactants, size of the initially formed particle, the reaction time during which the nanocrystal grows in size, and the reaction conditions (e.g., temperature). Currently, the standard method used by those skilled in the art for semiconductor nanocrystal synthesis is a manual batch method. For example, the manual batch method for producing CdSe semiconductor nanocrystals which uses TOP (TBP)/TOPO (TOP=trioctylphosphine, TBP=tri-n-butylphosphine, TOPO=trioctylphosphine oxide) to synthesize nanocrystalline CdSe, has been described in more detail previously (Murray et al., 1993, J. Am. Chem. Soc. 1993, 115:8706–8715). The batch method is capable of producing varying sizes of CdSe nanocrystals at a scale of up to several hundred milligrams of TOPO-capped CdSe at a time. While each reaction gives crystals of a particular size and of some monodispersity, it is very difficult to reproduce any given size and of a controlled monodispersity between batches. Additionally, in a manual batch method there is a relative inability to tailor the resultant nanoparticles to a specific size and of a limited monodispersity due to the lack of control of crystal growth and crystal size. Hence, the batch method particularly suffers from limitations when the electrical and optical properties are highly anisotropic. In addition, the method is not readily scaled up to accommodate a commercial scale production (in gram quantities).

In continuing the illustration of CdSe as an exemplary semiconductor nanocrystal, the following is a brief description of the manual batch method, which also includes particular trouble points encountered in performing the method. A first step involves drying a mass of TOPO by heating above 100° C. under vacuum. It is then backfilled with an inert gas and further heated to the desired reaction temperature. However, at the desired reaction temperature (300° C. or greater), the TOPO is beginning to decompose due to the high temperature. Thus, the length of time that the TOPO is heated before the injection takes place has a noticeable impact on both the final size and the dispersity of sizes in the product. The time used to heat the TOPO will vary from reaction to reaction and from group to group due to differences in heating efficiency between different heating modules and human error.

In a second step, a mixture of $Me_2Cd$, TOPSe (or TBPSe) and TOP (or TBP) is loaded into a syringe under inert atmosphere and injected quickly into the hot, molten TOPO, with vigorous stirring of the TOPO provided by a magnetic stirbar. In this step, the rate of injection is highly dependent on the individual operator. The total time needed for injection will also vary depending on the volume to be injected. In general, the longer time elapses between the beginning and end of an injection, the greater the disparity in the final product. Immediately following injection, the temperature of the reaction mixture begins to drop, and then begins to rise again. The temperature profile during the injection step directly affects the growth of the nanocrystals. While the kinetics of the reaction during the injection phase are poorly understood, the process of nucleation of the nanocrystals followed by a growth phase appears to be dependent on the concentration of the monomer (e.g., $Me_2Cd$ precursor), temperature of the mixture, and time of reaction. During injection of starting reactants, the temperature drops dramatically. The temperature change is critical to the kinetics of the reaction; and hence, has a direct effect on the final product.

In a third step, the heating is continued either for a length of time chosen by the operator, or until the crystals have reached the desired size, as determined by removing an aliquot of the solution and measuring its uv-vis spectrum. When the endpoint is reached, the mixture is cooled and the crystals collected and purified. By removing aliquots of the reaction mixture and measuring the uv-vis spectrum, the operator can monitor the size and dispersity profile of the reaction. However, removal of reaction mixture from the reaction flask is potentially dangerous, as the reaction mixture is pyrophoric.

Thus, a need exists in the art for a process for producing semiconductor nanocrystals in which variables of the reaction are readily controlled in synthesizing semiconductor nanocrystals of a uniform size on a relatively large scale economically and efficiently.

SUMMARY OF THE INVENTION

A principle object of the present invention is to provide a continuous flow process for producing semiconductor nanocrystals which allows significant control over the production process.

Another object of the present invention is to provide for selection of reaction characteristics (e.g., appropriate flow rate, and temperature) in a continuous flow process in controlling the size and monodispersity of resultant semiconductor nanocrystals produced.

Another object of the present invention is to provide for a system in which parameters such as flow rate, temperature, and nucleation may be variably controlled in a method of producing semiconductor nanocrystals in a continuous flow process.

Another object of the present invention is to provide a system and process for the synthesis of semiconductor nanocrystals whose fluorescent properties can be tailored to a desired excitation spectrum by controlling the size of the semiconductor nanocrystals produced.

The above and related objects are achieved by providing a system and continuous flow process for producing monodisperse semiconductor nanocrystals, and which provide a reliable and reproducible method for varying the size of the monodisperse semiconductor nanocrystals produced. The system used in the process comprises, in series, reservoirs for the starting materials, a section in the flow path of the continuous flow process ("mixing path") in which the starting materials comprising a metal cation source and an anion source (preferably, non-metal) are mixed, a section of the flow path of the continuous flow process ("first reactor") in which initial formation (e.g., nucleation) of nanocrystals occurs, another section in the flow path of the continuous flow process ("second reactor") in which controlled growth of the nanocrystals occurs, and another section of the flow path of the continuous flow process ("growth termination path") in which the growth of the nanocrystals is halted (e.g., such as by a cooling process). By controlling the reaction conditions (e.g., proportion of starting materials, and the temperature and time along various points of the flow path of the continuous flow process), the system and process permits precise control over the basic particle size and monodispersity of semiconductor nanocrystals produced.

DETAILED DESCRIPTION OF THE INVENTION

Definitions:

By the term "semiconductor nanocrystals" is meant, for purposes of the specification and claims to refer to quantum dots (crystalline semiconductors) comprised of a core comprised of at least one of a Group II-VI semiconductor material (of which ZnS, and CdSe are illustrative examples), or a Group III-V semiconductor material (of which GaAs is an illustrative example), or a combination thereof. In an additional embodiment, the semiconductor nanocrystal may further comprise a selected dopant (e.g., with a fluorescence property) such as a rare earth metal or a transition metal, as known to those skilled in the art. The doping may be accomplished by using a suitable chemical precursor containing the selected dopant which is added in the continuous flow process; and in a more preferred embodiment, the selected dopant is added in a proper amount for doping during a stage of the continuous flow process such as in the nucleation step or controlled crystalline growth step so that the selected dopant is incorporated as part of, or embedded within, the crystal lattice of the semiconductor core material. In a preferred embodiment, and as selected from the aforementioned semiconductor materials, the semiconductor nanocrystal comprises a metal cation and an anion (e.g., the anion comprising a chalcogenide when forming a Group II-VI material, or comprising a pnictide when forming a Group III-V material) which requires, in a formation process of producing the semiconductor nanocrystal, a mixing step, a nucleation step, and a controlled growth step. In a more preferred embodiment, the semiconductor nanocrystal comprises a metal cation and the anion which requires, in a formation process of producing the semiconductor nanocrystal, a mixing step, a nucleation step, and a controlled growth step; and wherein more than one temperature is used in the continuous flow process (e.g., temperature at which the nucleation step is conducted differs with the temperature at which the controlled growth step is conducted and/or with the temperature of the growth termination step). In a most preferred embodiment, as illustrated herein, the semiconductor nanocrystal comprises CdSe. Preferred semiconductor nanocrystals of a preferred semiconductor material may be produced using the process and system of the present invention to the exclusion of semiconductor nanocrystals other than the preferred semiconductor nanocrystals (e.g., semiconductor nanocrystals comprised of a semiconductor material other than that used to produce the preferred semiconductor nanocrystals).

By the term "particle size" is meant, for purposes of the specification and claims to refer to a size defined by the average of the longest dimension of each particle as can be measured using any conventional technique. Preferably, this is the average "diameter", as the semiconductor nanocrystals produced using the process and system according to the present invention are generally spherical in shape (however, while preferably and generally spherical in shape, irregularly shaped particles may also be produced using the process and system). In a preferred embodiment, the semiconductor nanocrystals comprise a particle size (as measure by diameter) in the range of approximately 1 nanometer (nm) to approximately 20 nm.

By the term "monodisperse" is meant, for purposes of the specification and claims to refer to a population of semiconductor nanocrystals having a narrow particles size spectrum. In a preferred embodiment of the present invention, a uniform size and a defined monodispersity of semiconductor nanocrystals produced using the system and process according to the present invention refer to a population of semiconductor nanocrystals wherein substantially all (85% or greater) comprise a desired size comprising an average particle size +/−50% of the average particle size. In a more preferred embodiment, the semiconductor nanocrystals produced using the process and system according to the present invention have a particle size that varies by only about +/−10% around the average particle size of semiconductor nanocrystals in that population produced. In a more preferred embodiment, the semiconductor nanocrystals produced using the process and system according to the present invention have a particle size that varies by less than +/−4% around the average particle size of semiconductor nanocrystals in that population produced. In another preferred embodiment, the average particle size is within the range of approximately 1 nm to approximately 20 nm.

By the term "sol" is meant, for purposes of the specification and claims to refer to a two phase system comprising the coordinating solvent (in combination with a carrier solution, if any, accompanying the starting materials), and the crystalline particles formed as a result of the organometallic reaction between the metal cation and the anion. Thus, and as corresponding to FIG. 1 the sol is formed in the first reactor and may be flowed through the various subsequent stages of the system and out the exit path. In that regard, for example, at the second reactor and in subsequent stages of the system, the sol may further comprise semiconductor nanocrystals formed as a result of the process.

Figure 1:
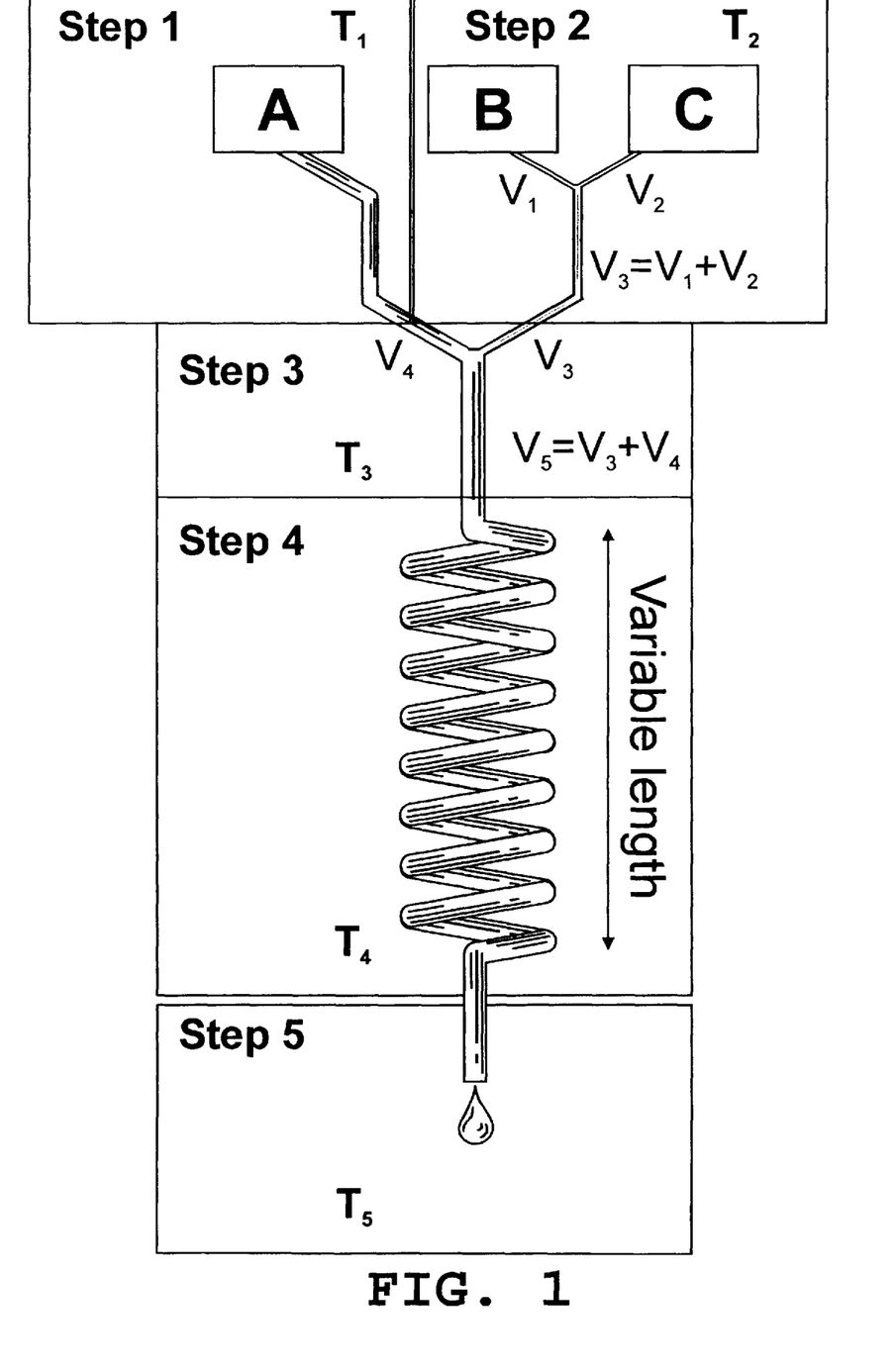
FIG. 1 is a flowchart illustrating the steps of the continuous flow process according to the present invention.

Generally, development of nanocrystals involves three distinct phases: nucleation (initial formation of particle nuclei), sustained crystal growth (addition of metal cation and anion to the growing faces of crystal lattices of particle nuclei rather than being consumed in the formation of new particle nuclei), and termination of crystal growth. The system and continuous flow process according to the present invention are directed to precisely controlling parameters for controlling the crystallization processes involved in production of semiconductor nanocrystals. FIG. 1, by way of example, is a flow diagram which graphically represents a preferred embodiment of the continuous flow process according to the present invention, wherein the flow proceeds successively through the various steps of the process (each step comprising an "individual operation"), and through various points in a flow path (each point comprising a "system position") as follows:

| Step | System Position | Individual Operation |
|---|---|---|
| 1 | Reservoir for coordinating solvent | heating of coordinating solvent ("A"); |
| 2 | mixing path | Mixing of metal cation source ("B") and an anion source ("C") |
| 3 | first reactor | addition of A to B + C, and particle nucleation; |
| 4 | second reactor | controlled crystalline growth; |
| 5 | growth termination path and outlet path | termination of crystalline growth, and outflow through exit path. |

Some distinctive features of a preferred embodiment of the system and continuous flow process of the present invention may be apparent from FIG. 1 and the following descriptions. In the continuous flow process according to the present invention, a very narrow spectrum of particle sizes (e.g., monodispersity) is an objective. A condition that is preferred for achieving this objective is that each step or point in the process in which mixing is desired between two flow streams in the flow path, the mixing is carried out intensively and in a time efficient manner (e.g., in a minimal amount of time to achieve the desired grade of mixing). Applying this preferred condition to the system and process, at Steps 2 & 3 in which respective components are mixed, the volume in which the mixing occurs is desirably minimized. It will be apparent to one skilled in the art that there are a number of ways to minimize the volume of mixing so as to maximize mixing. For example, in one preferred embodiment as illustrated in the flow diagram of FIG. 1, at a point where two flow streams meet, mixing is performed by that juncture of the flow path which is substantially in a form comprising a "Y" configuration of flow tubing.

Additionally, in a preferred embodiment, the point of flow which follows the juncture of the "Y" configuration is different in diameter than either flow path preceding the juncture; and preferably wider in diameter than either flow path. Thus, for example, the volume of the flow path following the point of mixing (e.g., FIG. 1, $V_3$ at Step 2; $V_5$ at Step 3) comprises approximately the sum of the volumes of the flow streams which meet at the juncture (e.g., FIG. 1, $V_3 \cong V_1 + V_2$ at Step 1; $V_5 \cong V_3 + V_4$ at Step 2). Further, in a preferred embodiment, the time ("t") that a flow stream resides ("residence time") in a certain point of the flow path is generally proportional to the length ("l") of the flow path (e.g., of the flow tubing containing the flow path), and inversely proportional to the cross-sectional area, at that point in the flow path. Thus, for example, the residence time of the fluid stream in the second reactor for controlled crystalline growth is generally proportional to the length of the flow path (e.g., flow tubing), and inversely proportional to the square of the diameter of the flow path, comprising the second reactor. As illustrated for the second reactor in FIG. 1, the length of the flow path may be varied (as may be its diameter), which affects the residence time of the sol in the second reactor and, hence, may affect the resultant size of the nanocrystals produced by the process and system. While generally there may be a pressure applied at different entry points of the flow path (at the two or more reservoirs for injecting a fluid stream into the flow path) which may affect flow rate, in a preferred embodiment the flow rate of the fluid stream in a flow path is generally controlled by parameters comprising the diameters of the flow path, and the viscosity of the flow stream. Where a flow stream requires heating to be of the desired viscosity for the desired flow rate, then temperature may be used as a variable by which the parameter of viscosity may be controlled. Thus, in a preferred embodiment of the system and continuous flow process according to the present invention, parameters which are precisely and variably controlled comprise temperature(s), and the concentration of the component being added to the flow path (e.g., the desired ratio in which the components are added).

Provided is a system for a continuous flow process for production of semiconductor nanocrystals, the system comprising a flow path; at least two reservoirs; at least one mixing path, wherein a mixing path comprises a section in the flow path where a plurality of components (e.g., a component being selected from the group consisting of a coordinating solvent, a starting material comprising a metal cation source, a starting material comprising an anion source, and a combination thereof) are mixed during the continuous flow process; a first reactor, wherein the first reactor comprises a section in the flow path in which nucleation of particles (e.g., involving the metal cation and the anion) occurs during the continuous flow process; a second reactor, wherein the second reactor comprises a section in the flow path in which crystalline growth occurs during the continuous flow process; and a growth termination path, wherein the growth termination path comprises a section in the flow path in which crystal growth is halted during the continuous flow process. The system may further comprise an outlet path, wherein the outlet path is operably linked to the growth termination path, and wherein the outlet path comprises a point in the flow path in which the semiconductor nanocrystals formed during the continuous flow process are flowed out of the system.

In the system and continuous flow process according to the present invention, a metal cation and an anion are reactants in a organometallic reaction which results in the formation of the semiconductor nanocrystals of a desired particle size and monodispersity. In a preferred embodiment, the metal cation ion source typically comprises a metal salt or metal halide, but also could be in the form of metal trialkyls (e.g., metal 1–6 carbon trialkyls) for Group III–V semiconductor materials, or metal dialkyls for Group II–VI semiconductor materials. Preferably, the reservoir containing the metal cation source contains a solution of the metal cation. Typically, the solution comprises an organic solvent which serves as a carrier solution in which the metal cation source is solubilized. Preferably, the reservoir containing the anion source contains a carrier solution in which the anion source is solubilized. As will be apparent to one skilled in the art, typically the carrier solution will comprise an organic solvent, the choice of which will depend on factors which include, but are not limited to the choice of starting materials (metal cation source, the anion source, the coordinating solvent, and a combination thereof), the temperatures encountered in the continuous flow process, chemical compatibility with the starting materials, chemical compatibility with the system material(s) (e.g., reservoir, and flow tubing comprising the flow path) with which it contacts during the continuous flow process, and the solubility of the formed nanocrystals in the carrier solution. In general, the starting materials for production of Group II–VI semiconductor nanocrystals or Group III–V semiconductor nanocrystals may be in an carrier solution comprising an organic solvent comprising trioctylphosphine (TOP), or tri-n-butylphosphine (TBP), or trioctylphosphine oxide (TOPO), an octylamine (for Group II–VI starting materials), a dodecylamine (for Group II–VI starting materials), or a chemically compatible combination thereof. Generally, a trialkylphosphine that is liquid at room temperature, that has a boiling point above the temperature at which the starting materials are reacted at atmospheric pressure, and that is chemically compatible with the starting material which is solubilized therein, may be used as a carrier solution. Typically in the continuous flow process according to the present invention, when the carrier solution reaches the first reactor, the carrier solution (as well as the starting material solubilized therein) is mixed with a heated (above room temperature) coordinating solvent. Hence, in a preferred embodiment the carrier solution is soluble in the coordinating solvent, and is chemically compatible (does not enter into a chemical reaction deleterious to the process) with the coordinating solvent.

In the continuous flow process according to the present invention, the steps of nucleation and controlled growth of the nanocrystals are performed in the presence of an organic solvent termed the "coordinating solvent". The coordinating solvent is used in an effective amount to form a sol with the starting materials, and to generally provide an environment (a) in which the nucleated particles or growing nanocrystals are desirably unaggregated, (b) that is generally noninterfering with nanocrystal nucleation or formation or growth (at least not generally interfering with nanocrystal formation up to the desired particle size), and (c) that does not promote flocculation of the forming nanocrystals or formed nanocrystals during the time period of when the sol is present in the system for continuous flow production of the semiconductor nanocrystals according to the present invention. The coordinating solvent will depend on factors which include, but are not limited to, viscosity (e.g., as may be related to flow properties), thermal stability (e.g., with respect to the temperatures encountered in the continuous flow process), the choice of starting materials (and may further include choice of carrier solution in which the starting materials are provided), chemical compatibility with the starting materials, chemical compatibility with the system material(s) with which it contacts during the continuous flow process, and the solubility of the formed nanocrystals in the solvent. Typically, the coordinating solvent is compatible for use for its intended purposes at a temperature that may be found in the range of from about 40° C. to about 500° C. Suitable organic solvents for use as a coordinating solvent may be an organic solvent comprising TOPO (e.g. for Group II–VI or Group III–V), TOP (e.g. for Group II–VI or Group III–V), hexadecylamine (e.g. for Group II–VI), octylamine (e.g. for Group II–VI), diglyme (e.g. for Group III–V), triglyme (e.g. for Group III–V), tetraglyme (e.g. for Group III–V), or a chemically compatible and functional (for its intended purpose) combination thereof. It will be apparent to one skilled in the art that a preferred choice of coordinating solvent may depend on the choices of starting materials and carrier solution. As an illustrative non-limiting example, generally a combination comprising TOPO/TOP (carrier solution/coordinating solvent) is not particularly suitable for producing nanocrystals comprising ZnS; however, a combination comprising TOP/hexadecylamine may be desirably suitable for producing nanocrystals comprising ZnS.

Figure 2:
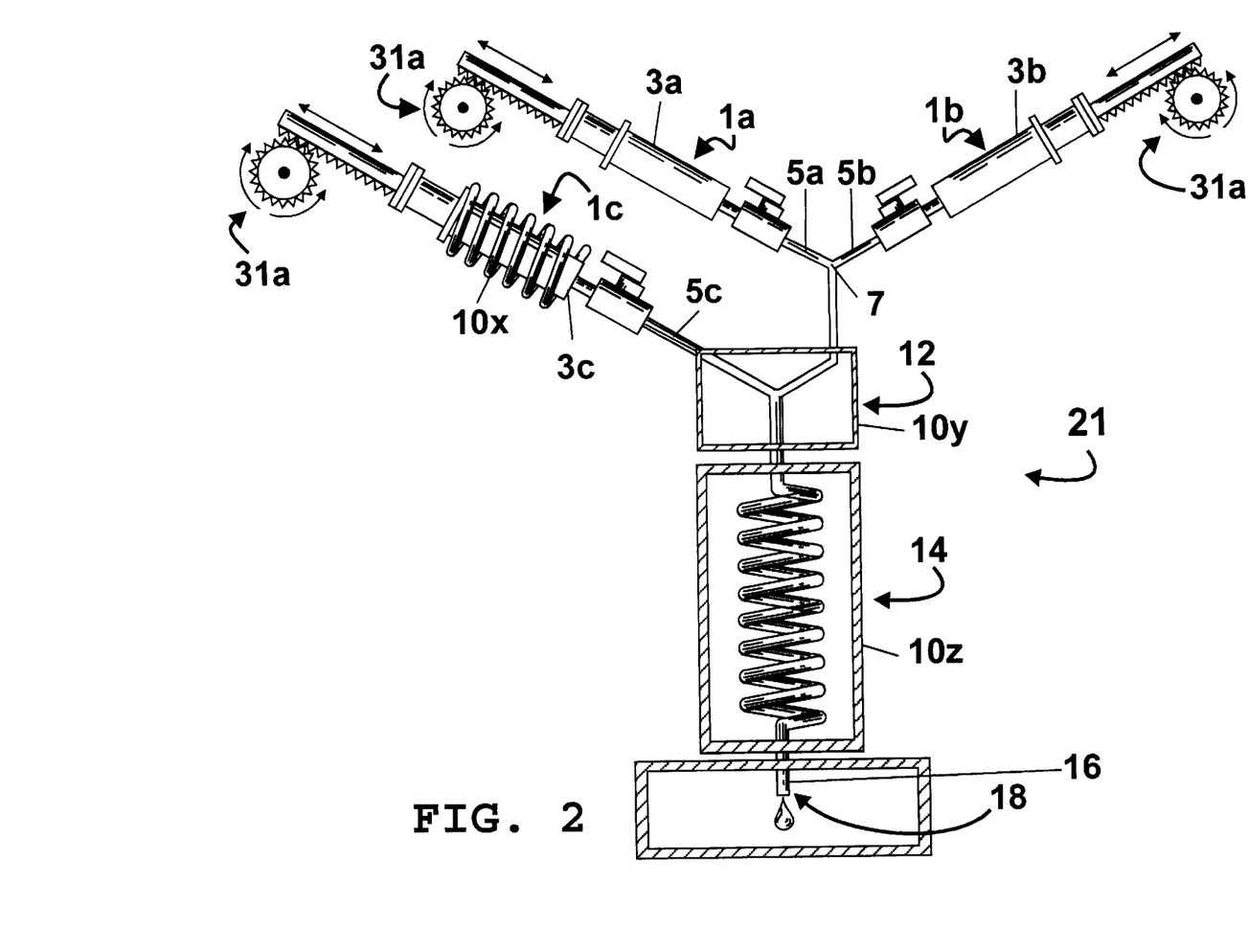
FIG. 2 is an illustration of an embodiment of system according to the present invention.

As illustrated in FIG. 2, a preferred embodiment of the apparatus comprising the system for carrying out this continuous flow process is preferably comprised of the following individual parts: at least two reservoirs (illustrated are reservoirs 1a, 1b, 1c for the metal cation source, the anion source, and the coordinating solvent, respectively); a flow rate control means for each reservoir (illustrated are flow rate control means for 3a, 3b, 3c for controlling the flow rate of the respective component from reservoirs 1a, 1b, and 1c); a feed tube path from each reservoir (illustrated are feed tube paths 5a, 5b, 5c for introducing the respective component into the appropriate points of the flow path of the continuous flow process); a mixing path (illustrated is mixing path 7); one or more heat sources (illustrated are heat sources 10x, 10y and 10z); a first reactor (illustrated is first reactor 12); a second reactor (illustrated is second reactor 14); a growth termination path (illustrated is growth termination path 16), and an outlet path (illustrated is outlet path 18). The individual parts comprising the system are connected or otherwise operably linked to maintain a variably controlled, closed environment in providing a continuous flow process for the production of semiconductor nanocrystals. The detailed relationship between the individual parts is not critical to the invention, insofar as to whether they be manufactured as separate components which are then fabricated or operably linked to form the system, or as an integral body portion which forms the system. Likewise, the specific character of the materials used to manufacture the individual parts does not in and of itself constitute the subject matter of the invention; hence, a wide latitude of choice may be exercised in selecting a material suitable for the function of the respective individual part in forming the system. Generally, the material which forms each individual part of the system must be compatible with (e.g., suitable to maintain structural integrity and to perform its intended function in the system) the temperature to which it is subjected, as well as be compatible with (e.g., suitable to be chemically non-reactive with, to resist corrosion, and to perform its intended function in the system) the one or more chemical components (e.g., one or more reactants, solvents, sol, and the like) to which it is exposed in the system. In that regard, a preferred material for fabricating the flow tubing comprising the flow path is stainless steel. Likewise, the size or fluid capacity of the system, and of the individual parts of which it is comprised, may vary depending on factors including, but not limited to, the desired throughput of starting materials and coordinating solvent, the desired output of the system (e.g., the amount of semiconductor nanocrystals to be produced over a given amount of time), and the nature of the starting materials. It will be appreciated by those skilled in the art that the system and its individual parts may be varied in dimension (e.g., capacity, overall width, overall length, diameter, and the like) in producing a system suitable for its intended function according to the present invention. Thus, the arrangement and dimensions which are illustrated herein are merely for purposes of explanation and illustration, and are not intended to limit the invention in any way.

In continuing with the embodiment of the system for carrying out this continuous flow process illustrated in FIG. 2, reservoirs 1a, 1b, 1c each comprise a gas tight syringe which is chemically compatible with its respective contents contained therein. Thus, for example, reservoir 1a comprises a gas tight syringe 3a in which is loaded starting material B comprising a metal cation solubilized in a carrier solution. Syringe 3a may further comprise a gas tight adaptor and valve combination which may be used for loading syringe 3a with starting material B prior to operably securing syringe 3a to syringe pump 31a. In an operative arrangement with pump 31a, starting material B may be pumped through syringe 3a and into feed tube path 5a at a controlled rate of flow. Additionally, syringe pump 31a may be operably connected to a suitable pump motor, which in turn may be operably connected to a computer with appropriate software, such that pump 31a may be used to control the rate of flow of starting material B through syringe 3a and feed tube path 5a. Further, as controlled by the pumping rate of pump 31a (as applied to the plunger of syringe 3a in dispensing starting material B), the rate of flow may be varied depending on the choice of starting material B and/or the desired size of the resultant semiconductor nanocrystals produced by the system. However, in a preferred embodiment, the residence time of starting material B in reservoir 1a is substantially controlled by the diameter of the channel of feed tube path 5a to which reservoir 1a is operably connected. As illustrated by FIG. 2, a similar arrangement may be applied to reservoirs 1b and 1c and their respective contents. Thus, in the continuous flow process, reservoirs 1a, 1b, and 1c may each be selectively controlled to deliver their respective contents (e.g., starting material or coordinating solvent) into first reactor 12 at a controlled rate of flow; and reservoirs 1a, 1b, and 1c may be collectively controlled to be capable of maintaining a desired, constant flow rate of the resultant sol through first reactor 12 of system 21. System 21 may further comprise one or more sensors for monitoring the rate of flow through the system at any given, desired point.

As an alternative, the system may comprise only two reservoirs. For example, a first reservoir may contain one of the starting materials, and a second reservoir may contain a combination comprising the other starting material and the coordinating solvent. As an illustrative, nonlimiting example, the system may comprise two reservoirs, wherein a first reservoir ("reservoir 1a") contains starting material B comprising a metal cation source, and wherein a second reservoir ("reservoir 1c") contains starting material C (comprising an anion source) and also a coordinating solvent which is chemically compatible with starting material B. Yet another alternative with two reservoirs includes reservoir 1a containing starting material C (comprising an anion source), and reservoir 1c containing starting material B (comprising a metal cation source) and also a coordinating solvent which is chemically compatible with starting material B. In either alternative embodiment, each reservoir is operably connected to a respective feed tube path for flowing the respective contents further into the system.

Figure 3:
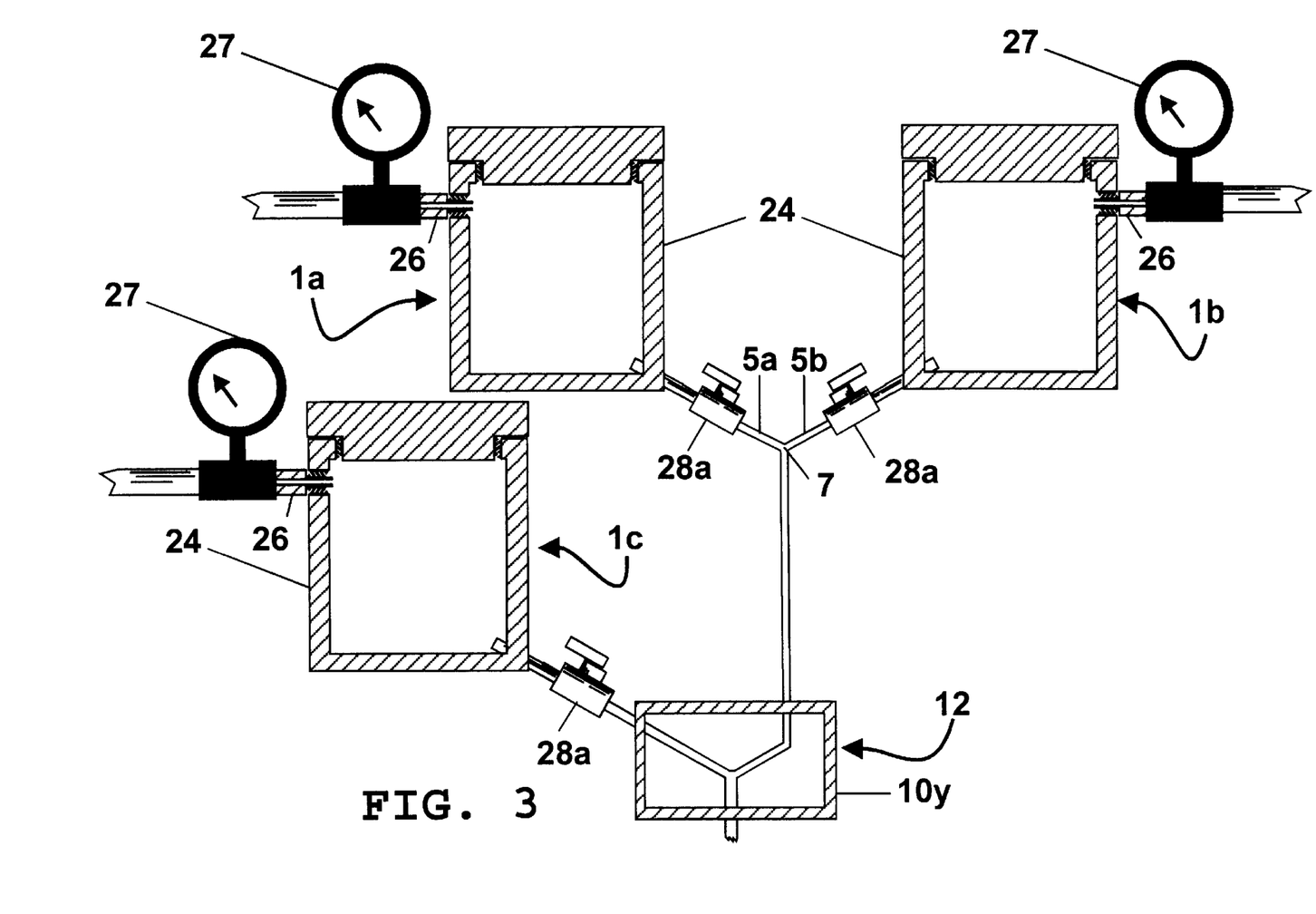
FIG. 3 is an illustration of another embodiment of portions of the system according to the present invention.

Alternatively, and as illustrated in FIG. 3, reservoirs 1a and 1b may each comprise a container 24 which further comprises a gas tight fitting 26 through which an inert gas (e.g., argon) is pumped, and a gas tight exit port which is operably connected to the respective flow rate control means 28a and feed tube path. Depending on the starting materials and carrier solution used, reservoirs 1a and 1b may comprise a synthetic resin material such as a plastic. In this alternative embodiment, and as a nonlimiting illustration, an inert gas may be pumped through gas tight fitting 26. Thus, by controlling the gas pressure in the reservoir, control may also be exercised over the flow of starting material B through reservoir 1a, as well as contributing to the control over the rate of flow of components in system 21 for continuous flow production of semiconductor nanocrystals according to the present invention. However, in a preferred embodiment, the residence time of starting material B in reservoir 1a is substantially controlled by the diameter of the channel of feed tube path 5a to which reservoir 1a is operably connected. Gas gauge (manometer) 27 may be operably connected to the inert gas source and gas tight fitting 26 to provide for metering of the gas pressure. In other embodiments, a pumping means (e.g., peristaltic pump or other suitable pump) may be used to pump the contents of a reservoir into a feed tube path.

It may be desirable to heat (e.g., to a temperature above room temperature) the contents (e.g., the coordinating solvent, or the coordinating solvent and a starting material) of reservoir 1c. For example, it may be desirable to heat such contents (a) if the coordinating solvent is not sufficiently fluid (e.g., is too viscous or solid) at room temperature to be injected from the reservoir through the feed tube path, and/or (b) to bring the contents to, or close to, the temperature of the first reactor in which it is injected to more closely control the temperature in the first reactor. As illustrated in FIG. 2, heat source 10x may be used to heat the contents of reservoir 1c, if desired. For example, heat source 10x heats the coordinating solvent to a desired temperature, and/or once the coordinating solvent reaches the desired temperature, heat source 10x maintains the temperature of the coordinating solvent in reservoir 1c. In a preferred embodiment in which the coordinating solvent is a solvent which hardens or becomes very viscous when cooled, maintaining the coordinating solvent at the desired temperature for it to be fluid (e.g., molten) is important for optimizing flow of the coordinating solvent out of reservoir 1c. Thus, in a preferred embodiment, an intended function of heat source 10x is to maintain very precisely the temperature of the fluid coordinating solvent for injection out of reservoir 1c. As will be apparent to one skilled in the art, the temperature at which the coordinating solvent is maintained in reservoir 1c will depend on the choice of coordinating solvent. Some coordinating solvents which are fluid at room temperature do not require heating to be sufficiently fluid to be injected out of reservoir 1c, and hence, heat source 10x may not be necessary for the system. For coordinating solvents which are not sufficiently fluid at room temperature, generally the coordinating solvent needs to be heated to a temperature greater than its melting point. As a general, non-limiting guideline, this temperature will typically be in the range of from about 60° C. to about 300° C., depending on the choice of coordinating solvent. For example, when using TOPO as a preferred coordinating solvent, the preferred temperature at which the TOPO is maintained in reservoir 1c is in the range of from about 60° C. to about 300° C. While a preferred embodiment illustrated in FIG. 2 shows heat source 10x at the exterior of reservoir 1c, it will be apparent to one skilled in the art that, with the proper safety and functional considerations, heat source 10x may be situated in the interior thereof. As illustrated in FIG. 2, heat source 10x may comprise a heater element (e.g., comprised of electrical resistance heating wire) which is wound or wrapped around, and may be in physical contact with, the exterior of reservoir 1c for heating the coordinating solvent contained within reservoir 1c. Alternatively, heat source 10x may comprise a heated chamber or heater blanket into which is positioned reservoir 1c. Thus, heat source 10x may extend along part or all the length of reservoir 1c. Heat source 10x may further comprise a temperature controller for monitoring and regulating the temperature of heat source 10x. In a preferred embodiment, feed tube path 5c is made from a material having a high coefficient of thermal conductivity such that the heat from heat source 10x and reservoir 1c is conducted thermally into feed tube path 5c to maintain feed tube path 5c at substantially the same temperature as the heated coordinating solvent. Thus, heated feed tube path 5c enables flow of the coordinating solvent at its fluid temperature as it is injected from reservoir 1c into first reactor 12 of system 21.

As illustrated in FIGS. 2 & 3, feed tube paths 5a and 5b are operably connected to mixing path 7. Thus, starting materials B & C, injected into feed tube paths 5a and 5b respectively, are flowed into mixing path 7 in proportion to each other in corresponding to the desired formulation for preparation of the particular, desired semiconductor nanocrystals. As previously discussed herein in more detail, in one preferred embodiment as illustrated in FIGS. 2 & 3, a mixing path 7 is formed by the juncture of feed tube paths 5a and 5b in forming substantially a "Y" configuration of flow tubing.

As illustrated in FIGS. 2 & 3, first reactor 12 is operably connected to feed tube path 5c and mixing path 7. After starting materials B & C are mixed in mixing path 7, the mixture continues the flow process and enters into first reactor 12. Also flowed into first reactor 12, via feed tube path 5c, is the coordinating solvent. Thus, in first reactor 12, contact and mixing occurs between the mixture comprising starting materials B & C and the coordinating solvent, in forming a sol. Alternatively, in an embodiment when only two reservoirs are used, first reactor 12 may further comprise mixing path 7. For example, in first reactor 12 the juncture of the feed tube path from reservoir 1c and the feed tube path from reservoir 1a comprises mixing path 7. As to the function of the first reactor in the system, in a preferred embodiment the first reactor provides an environment conducive for particle nucleation to occur between the metal cation of starting material B and the anion of starting material C. In a more preferred embodiment, the first reactor provides a heated environment of a sufficient temperature at which the metal cation source becomes hydrolyzed, and of sufficient micro-mixing between the contents therein, to allow for particle nucleation to be substantially initiated as a result of an organometallic reaction between the metal cation and the anion. In general, nucleation and termination thereof, may be affected by the concentrations of starting materials, the grade of mixing of the starting materials, and temperature. Thus, the process of particle nucleation occurring within the system may be manipulated and regulated by precisely controlling the temperature of the sol, the proportion of available metal cation to available anion, and residence time of the sol in the first reactor (e.g., as may be controlled by the length and diameter of the flow path comprising the first reactor). As illustrated in FIG. 2, heat source 10y heats the first reactor and the sol formed therein to a desired uniform temperature and/or maintains the sol at the desired uniform temperature while contained in the first reactor. As will be apparent to one skilled in the art, the uniform temperature at which the first reactor 12 and its contents is maintained during the continuous flow process will depend on factors that include, but are not limited to, the nature (size, composition, etc.) of the first reactor, the choice of coordinating solvent, the choices of starting materials B & C, and the desired characteristics of the semiconductor nanocrystals produced by the system and process according to the present invention. Generally, this temperature may be in the range of from about 2000° C. to about 500° C. For example, when using TOPO as a preferred coordinating solvent, and the preferred starting materials comprise a metal cation source with the cation comprising Cd and an anion source comprising an anion Se, the preferred temperature at which the first reactor is maintained during the process is in the range of from about 250° C. to about 300° C. While a preferred embodiment illustrated in FIG. 2 shows heat source 10y around the exterior of first reactor 12, it will be apparent to one skilled in the art that, with the proper safety and functional considerations, heat source 10y may be situated in the interior thereof. Heat source 10y may comprise a heater element (e.g., comprised of electrical resistance heating wire) which is wound or wrapped around, and may be in physical contact with, the exterior of first reactor 12 for heating the contents within the first reactor. Alternatively, heat source 10y may comprise a heated chamber or heater blanket or heat block or heat bath into which is positioned the first reactor. Thus, heat source 10y may extend along part or all the length of first reactor 12. Heat source 10y may further comprise a temperature controller for monitoring and regulating the temperature of heat source 10y. In another embodiment, heat source 10y may be a laser or infrared source which is used to heat the contents of first reactor 12. In another embodiment, instead of a heat source, a photoactivation source comprising a UV light source is used to assist in initiation of nucleation. For example, first reactor may be comprised of quartz, and the contents therein may be exposed and chemically affected (e.g., breaking of chemical bonds to release metal cation from metal cation source) by UV light source 10y.

As illustrated in FIGS. 1 & 2, second reactor 14 is operably connected to first reactor 12 such that the contents of the first reactor are flowed into the second reactor; i.e., the sol and nucleated particles formed in first reactor 12 are then flowed into second reactor 14. In a preferred embodiment, the second reactor provides an environment conducive for controlled particle growth (i.e., controlled nanocrystal growth). In a more preferred embodiment, the second reactor provides an environment conducive for controlled particle growth and in which further particle nucleation is inhibited. More particularly, by precisely controlling factors such as temperature, and the ratio of metal cation to anion, preferably a single burst of nucleation occurs in the first reactor after which further nucleation is minimized. In a preferred method, further nucleation is terminated by reducing the temperature of the flow path (e.g., at a desired location in the flow path which is subsequent to the first reactor) to the point that further nucleation is terminated. Thus, for example, in this preferred embodiment, the temperature of the second reactor is preferably a temperature lower than that of the first reactor (to halt further nucleation)

but still sufficient for sustaining the phase of crystalline growth. Alternatively, the temperature of a first portion of the second reactor is initially at a temperature lower than that of the first reactor (to halt further nucleation), and a second portion (remainder) of the second reactor is at a temperature for sustaining the phase of crystalline growth. Thus, the process of crystalline growth occurring within the system may be manipulated and regulated by precisely controlling the temperature of the sol, and the residence time of the sol in the second reactor. As illustrated in FIG. 1, the length of the flow path of the second reactor may be varied to provide a desired residence time for controlling crystalline growth in controlling the production of semiconductor nanocrystals of a desired size. As illustrated in FIG. 2, heat source 10z heats the second reactor and the sol contained therein to a desired temperature and/or maintains the sol at the desired temperature while contained in the second reactor. As will be apparent to one skilled in the art, the temperature at which the second reactor 14 and its contents is heated and/or maintained during the continuous flow process will depend on factors that include, but are not limited to, the nature (size, composition, etc.) of the second reactor, the choice of coordinating solvent, the choices of starting materials B & C, and the desired characteristics of the semiconductor nanocrystals produced by the system and process according to the present invention. Generally, this temperature may be in the range of from about 200° C. to about 400° C. For example, when using TOPO as a preferred coordinating solvent, and the preferred starting materials comprise a metal cation source with the cation comprising Cd and an anion source comprising an anion Se, the preferred temperature at which the second reactor is maintained during the process is in the range of from about 250° C. to about 300° C. While a preferred embodiment illustrated in FIG. 2 shows heat source 10z around the exterior of second reactor 14, it will be apparent to one skilled in the art that, with the proper safety and functional considerations, heat source 10z may be situated in the interior thereof. Heat source 10z may comprise a heater element (e.g., comprised of electrical resistance heating wire) which is wound or wrapped around, and may be in physical contact with, the exterior of second reactor 14 for heating the contents within the second reactor. Alternatively, heat source 10z may comprise a heated chamber or heater blanket or heat block or heat bath into which is positioned the second reactor. Thus, heat source 10z may extend along part or all the length of second reactor 14. Heat source 10z may further comprise a temperature controller for monitoring and regulating the temperature of heat source 10z.

As illustrated in FIGS. 1 & 2, following a step of controlled crystalline growth is a growth termination step occurring in growth termination path 16. As known to those skilled in the art, and depending on the nature of the desired semiconductor nanocrystals produced, growth termination may be achieved by one or more processes which include, but are not limited to, reducing the temperature of the sol containing the semiconductor nanocrystals to a temperature effective for halting further crystalline growth (e.g., a cooling process); and the addition of a crystal growth terminator, to the sol containing the semiconductor nanocrystals, in an effective amount for halting further crystalline growth after a desired size is obtained. With regard to crystal growth terminators, it will be apparent to one skilled in the art that a crystal growth terminator may be added or already present during the phase of crystalline growth. For Group III–V semiconductor nanocrystals, crystal growth terminators typically comprise polar organics such as nitrogen-containing or phosphorous-containing organics. Typical polar organics include pyridine and quinoline. With regard to exposing the sol containing the semiconductor nanocrystals to a temperature-lowering step in the growth termination path, it will be apparent to one skilled in the art that there are a number of means to achieve an effect of lowering temperature from that used in the step of crystalline growth. For example, growth termination path 16 may be cooled by a heat source positioned to, and at an effective temperature for halting crystalline growth in, the continuous flow process, so that the sol flowing through the growth termination path is reduced to a temperature effective for halting further crystalline growth. Examples of heat sources which may be used with the present invention have been previously described herein. The rate of temperature-lowering may be controlled by such means as the residence time of the sol in the growth termination path (e.g., as related to the length and diameter of the flow tubing comprising the growth termination path), by a temperature controller when the temperature lowering is achieved by heat source, or by a combination thereof. Thus, for example, in a preferred embodiment, the temperature of growth termination path 16 is preferably a temperature lower than that of second reactor 14. Alternatively, the temperature of the growth termination path is initially at a temperature lower than that of the second reactor (to halt further crystalline growth), and then is raised to a temperature for effectively sustaining the phase of termination of crystalline growth. As will be apparent to one skilled in the art, the temperature at which the growth termination path and its contents is cooled and/or maintained during the growth termination process will depend on factors that include, but are not limited to, the nature (size, composition, etc.) of the growth termination path, the choice of coordinating solvent, the choices of starting materials B & C, and the desired characteristics of the semiconductor nanocrystals produced by the system and process according to the present invention. Generally, this temperature may be in the range of from about room temperature to about 275° C. For example, when using TOPO as a preferred coordinating solvent, and formed are CdSe nanocrystals, the preferred temperature at which the growth termination path during the process is a temperature less than about 260° C.

As illustrated in FIGS. 1 & 2, following the step of growth termination, the sol may then be flowed out of the system, e.g., through an exit path 18 of system 21 and into an container appropriate for collection and/or storage of the semiconductor nanocrystals produced by the process. For example, the semiconductor nanocrystals may flowed out of the system and into an ampoule containing an inert gas.

In one embodiment according to the present invention, a method for producing semiconductor nanocrystals in a continuous flow process comprising a flow path, the method comprises: flowing a metal cation source and flowing an anion source into a mixing path of the flow path, wherein the metal cation source and the anion source are mixed; flowing the mixture of the metal cation source and the anion source into a first reactor of the flow path and flowing a coordinating solvent into the first reactor, wherein the mixture and the coordinating solvent are mixed to form a sol; operating the first reactor under conditions to effect particle nucleation between the metal cation and the anion of the sol; flowing the sol from the first reactor to a second reactor in the flow path; operating the second reactor under conditions to effect controlled crystalline growth; flowing the sol from the second reactor to a growth termination path in the flow path, and operating the growth termination path under conditions to effect termination of crystalline growth; and flowing the sol from the growth termination path to an outlet path of the flow path. In a preferred embodiment, the metal cation source is flowed from a first reservoir containing the metal cation source, separately flowed from a second reservoir is the anion source, and separately flowed from a third reservoir is the coordinating solvent ("first", "second" and "third" used only for purposes of distinction). Operating conditions to effect particle nucleation in the first reactor, as previously described herein in more detail, include precisely controlling one or more variables comprising the temperature of the sol in the first reactor, the proportion of available metal cation to available anion for an organometallic reaction between them, and the residence time of the sol in the first reactor. Operating conditions to effect controlled crystalline growth between the metal cation and the anion of the sol in the second reactor, as previously described herein in more detail, include precisely controlling one or more variables comprising the temperature of the sol in the second reactor, the ratio of metal cation to anion for an organometallic reaction between them, and the residence time of the sol in the second reactor. In a more preferred embodiment, in addition to effecting controlled crystalline growth, the operating conditions of the second reactor also effect an inhibition of further particle nucleation. In this more preferred embodiment, the operating conditions may further comprise an increase in temperature for sustaining crystalline growth which follows an initial reduction in temperature that effects an inhibition of further particle nucleation. Operating conditions of the growth termination path to effect termination of crystalline growth, as previously described herein in more detail, include one or more processes comprising reducing the temperature of the sol in the growth termination path to a temperature effective for halting further crystalline growth, and adding a crystal growth terminator. Such operating conditions may further comprise an increase in temperature after the initial reduction in temperature.

In another embodiment according to the present invention, a method for producing semiconductor nanocrystals in a continuous flow process comprising a flow path, the method comprising: flowing a first starting material, and flowing a second starting material in combination with a coordinating solvent, into a first reactor in the flow path wherein the first starting material and the combination of the coordinating solvent and second starting material are mixed in a mixing path to form a sol; operating the first reactor under conditions to effect particle nucleation between a metal cation and a anion of the sol; flowing the sol from the first reactor to a second reactor in the flow path; operating the second reactor under conditions to effect controlled crystalline growth between the metal cation and the anion of the sol; flowing the sol from the second reactor to a growth termination path in the flow path; operating the growth termination path under conditions to effect termination of crystalline growth; and flowing the sol from the growth termination path to an outlet path in the flow path. In this embodiment, where the first starting material comprises a metal cation source, the second starting material comprises an anion source; and likewise, if the first starting material comprises an anion source, the second starting material comprises a metal cation source. The respective operating conditions affecting either particle nucleation, crystalline growth, or termination of crystalline growth, for this embodiment are as outlined above for the embodiment in which the starting materials and coordinating solvent are each separately flowed into the process.

EXAMPLE 1

It should be noted that, although the following example emphasizes the use of the present invention for the continuous flow production of CdSe nanocrystals, the system and method are general and can be applied to produce other Group II–VI semiconductor nanocrystals, and to produce Group III–V semiconductor nanocrystals, as will be apparent to those skilled in the art from the descriptions herein. More particularly, the optimum conditions for producing a semiconductor nanocrystal of a desired composition, size, and monodispersity, includes precisely controlling variables that include temperature at various points of the process, concentration of starting materials, and residence time in various points of the process. These variables are carefully controlled and optimum combinations thereof are determined through ordinary experimentation with the system and process to maximize the yield and desired characteristics of the resultant semiconductor nanocrystals produced.

The system arrangement was substantially that illustrated in FIG. 2. Table 1 provides flow tubing length at the various points along the flow path which are approximate because there is a gradual change in temperature between adjoining sections.

TABLE 1

| Flow path position | length of flow tubing |
| --- | --- |
| mixing path | 10 cm |
| first reactor | 2 cm |
| second reactor & growth | 4 m |
| termination path | 5 cm |

Listed in Table 2 are reaction conditions for this illustrative run. The system flow rate was approximately 5 ml/hour.

TABLE 2

| Starting Material B: | $Me_2Cd$ in TOP |
| --- | --- |
| Starting Material C: | TOPSe |
| Coordinating Solvent A: | TOPO |
| Ratio of C to B + A: | 66.6:33.3 |
| Reservoir 1c | Temp.: 70° C. |
| First reactor | Temp.: 275° C. |
| Second reactor | Temp.: 260° C. |
| Growth termination path | Temp.: room temperature |

Figure 4:
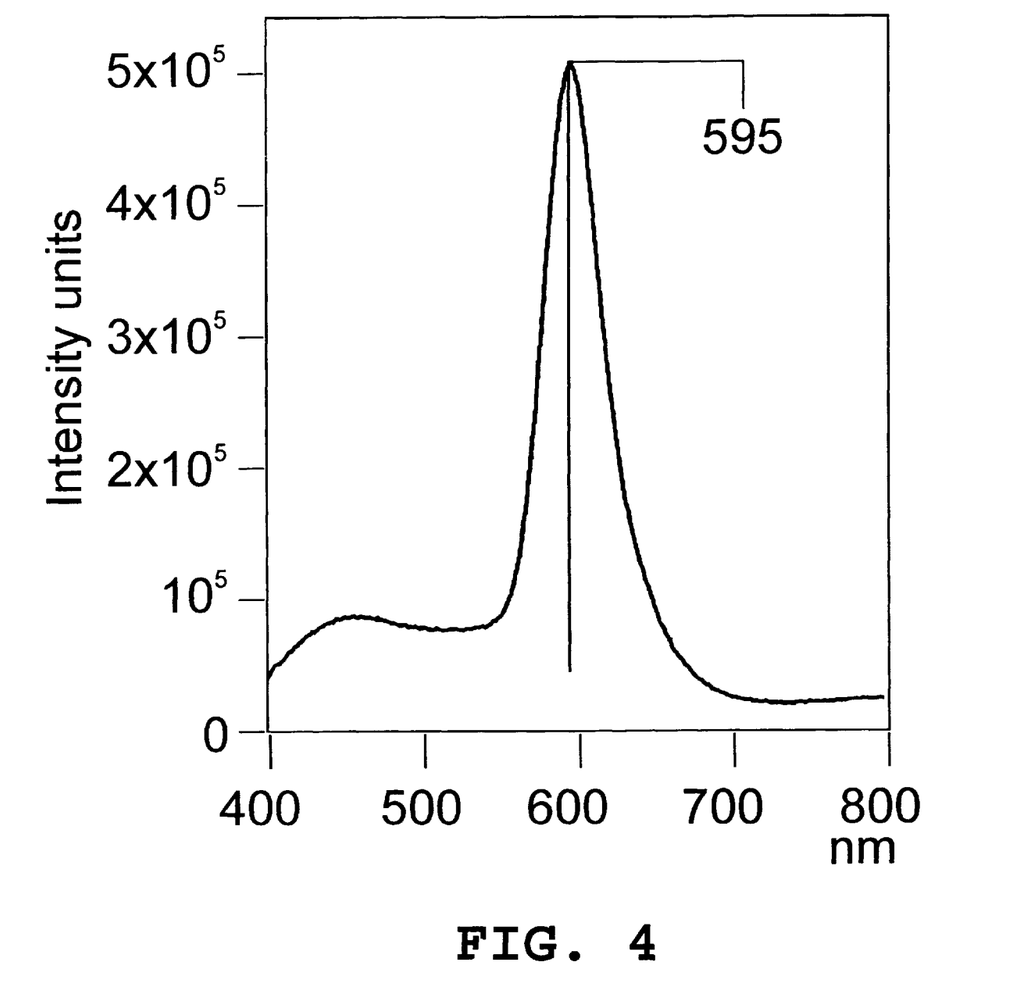
FIG. 4 is a wavelength spectrum of semiconductor nanocrystals formed by the process and system according to the present invention.

As shown in FIG. 4, using the process and system according to the present invention and using the parameters listed in Tables 1 and 2, analysis by spectrofluorimetry of the resultant semiconductor nanocrystals produced shows that they have an emission peak corresponding to 595 nm. These nanocrystals emit a fluorescence of a brilliant orange, upon excitation with a proper excitation wavelength (e.g., a UV light source). FIG. 4 also shows that the size distribution comprises a +/−3.3%. A monodispersity comprising a less than 5% variation in size is a significant improvement over the 10% variation in size commonly reported for semiconductor nanocrystals produced using a manual batch method.

The foregoing description of the specific embodiments of the present invention have been described in detail for purposes of illustration. In view of the descriptions and illustrations, others skilled in the art can, by applying, current knowledge, readily modify and/or adapt the present invention for various applications without departing from the basic concept, and therefore such modifications and/or adaptations are intended to be within the meaning and scope of the appended claims.

What is claimed:

1. A system for a continuous flow process for production of semiconductor nanocrystals, the system comprising a flow path; at least two reservoirs; at least one mixing path, wherein a mixing path comprises a section in the flow path where a plurality of components are mixed during the continuous flow process; a first reactor, wherein the first reactor comprises a section in the flow path in which nucleation of nanoparticles occurs during the continuous flow process; a second reactor, wherein the second reactor comprises a section in the flow path in which crystalline growth occurs during the continuous flow process; and a growth termination path, wherein the growth termination path comprises a section in the flow path in which crystal growth is halted during the continuous flow process.

2. The system according to claim 1, further comprising an outlet path, wherein the outlet path is operably linked to the growth termination path, and wherein the outlet path comprises a point in the flow path in which the semiconductor nanocrystals formed during the continuous flow process are flowed out of the system.

3. The system according to claim 1, further comprising a means of applying pressure for injecting a fluid stream into the flow path, wherein the means for applying pressure is selected from the group consisting of an inert gas, a syringe, a pumping means, and a combination thereof.

4. The system according to claim 1, wherein at least one reservoir further comprises a heat source.

5. The system according to claim 1, wherein the first reactor further comprises a heat source.

6. The system according to claim 1, wherein the second reactor further comprises a heat source.

7. The system according to claim 1, wherein the first reactor further comprises a UV light source.

8. The system according to claim 1, further comprising one or more sensors for monitoring flow rate through the system at a desired point in the system.

9. The system according to claim 1, wherein the system comprises three reservoirs, wherein a first reservoir contains a coordinating solvent, a second reservoir contains a metal cation source, and a third reservoir contains an anion source.

10. Semiconductor nanocrystals produced using the system according to claim 1, wherein the semiconductors have a size distribution that varies by less than 5%.

11. A method for producing semiconductor nanocrystals in a continuous flow process, the method comprises:
 (a) flowing a metal cation source and flowing an anion source into a mixing path, wherein the metal cation source and the anion source are mixed to form a mixture;
 (b) flowing the mixture from step (a) into a first reactor, and flowing a coordinating solvent into the first reactor, wherein the mixture and the coordinating solvent are mixed in the first reactor to form a sol;
 (c) operating the first reactor under conditions to effect particle nucleation between the metal cation and the anion of the sol;
 (d) flowing the sol from the first reactor to a second reactor;
 (e) operating the second reactor under conditions to effect controlled crystalline growth; and
 (f) flowing the sol from the second reactor to a growth termination path, and operating the growth termination path under conditions to effect termination of crystalline growth.

12. The method according to claim 11 further comprising flowing the sol from the growth termination path to an outlet path.

13. The method according to claim 11, wherein the metal cation source is flowed from a first reservoir; the anion source flowed from a second reservoir, and the coordinating solvent is flowed from a third reservoir.

14. The method according to claim 11, wherein operating conditions to effect particle nucleation in the first reactor comprise controlling a variable selected from the group consisting of temperature of the sol in the first reactor, proportion of available metal cation to available anion, residence time of the sol in the first reactor, and a combination thereof.

15. The method according to claim 11, wherein operating conditions to effect controlled crystalline growth between the metal cation and the anion of the sol comprise controlling a variable selected from the group consisting of temperature of the sol in the second reactor, proportion of available metal cation to available anion, residence time of the sol in the second reactor, and a combination thereof.

16. The method according to claim 15, wherein the operating conditions further effect an inhibition of further particle nucleation.

17. The method according to claim 11, wherein operating conditions to effect termination of crystalline growth comprise controlling a variable selected from the group consisting of temperature of the sol in the growth termination path, presence of a growth terminator, and a combination thereof.

18. Semiconductor nanocrystals produced using the method according to claim 11, wherein the semiconductors have a size distribution that varies by less than 5%.

19. A method for producing semiconductor nanocrystals in a continuous flow process, the method comprises:
 (a) flowing a first starting material, and flowing a second starting material in combination with a coordinating solvent, into a first reactor, wherein the first starting material and the combination of the coordinating solvent and second starting material are mixed to form a sol;
 (b) operating the first reactor under conditions to effect particle nucleation between the metal cation and the anion of the sol;
 (c) flowing the sol from the first reactor to a second reactor;
 (d) operating the second reactor under conditions to effect controlled crystalline growth; and
 (e) flowing the sol from the second reactor to a growth termination path, and operating the growth termination path under conditions to effect termination of crystalline growth.

20. The method according to claim 19 further comprising flowing the sol from the growth termination path to an outlet path.

21. The method according to claim 19, wherein the first starting material is flowed from a first reservoir; and a second starting material and the coordinating solvent is flowed from a second reservoir.

22. The method according to claim 19, wherein the first starting material comprises an anion source and the second starting material comprises a metal cation source.

23. The method according to claim 19, wherein operating conditions to effect particle nucleation in the first reactor comprise controlling a variable selected from the group consisting of temperature of the sol in the first reactor, proportion of available metal cation to available anion, residence time of the sol in the first reactor, and a combination thereof.

24. The method according to claim 19, wherein operating conditions to effect controlled crystalline growth between the metal cation and the anion of the sol comprise controlling a variable selected from the group consisting of temperature of the sol in the second reactor, proportion of available metal cation to available anion, residence time of the sol in the second reactor, and a combination thereof.

25. The method according to claim 24, wherein the operating conditions further effects an inhibition of further particle nucleation.

26. The method according to claim 19, wherein operating conditions to effect termination of crystalline growth comprise controlling a variable selected from the group consisting of temperature of the sol in the growth termination path, presence of a growth terminator, and a combination thereof.

27. Semiconductor nanocrystals produced using the method according to claim 19, wherein the semiconductors have a size distribution that varies by less than 5%.

* * * * *